(12) United States Patent
Fukui

(10) Patent No.: US 10,917,108 B2
(45) Date of Patent: Feb. 9, 2021

(54) SIGNAL PROCESSING APPARATUS AND SIGNAL PROCESSING METHOD

(71) Applicant: SONY CORPORATION, Tokyo (JP)

(72) Inventor: Takao Fukui, Tokyo (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/626,086

(22) PCT Filed: Jun. 21, 2018

(86) PCT No.: PCT/JP2018/023554
§ 371 (c)(1),
(2) Date: Dec. 23, 2019

(87) PCT Pub. No.: WO2019/009082
PCT Pub. Date: Jan. 10, 2019

(65) Prior Publication Data
US 2020/0212930 A1  Jul. 2, 2020

(30) Foreign Application Priority Data

Jul. 5, 2017 (JP) .................................. 2017-131854

(51) Int. Cl.
 H03M 7/32 (2006.01)
 G10L 19/16 (2013.01)
(Continued)

(52) U.S. Cl.
 CPC ......... H03M 7/3006 (2013.01); G10L 19/167 (2013.01); G11B 20/10481 (2013.01);
(Continued)

(58) Field of Classification Search
 CPC .... H03M 7/3006; H03M 3/02; H03M 7/3028; G10L 19/167; G11B 20/10481
(Continued)

(56) References Cited

U.S. PATENT DOCUMENTS 6,438,434 B1    8/2002 Kamiya
6,982,662 B2 *  1/2006 Heo .................. G11B 20/10527
                                                    341/106
(Continued)

FOREIGN PATENT DOCUMENTS

CN    1746800 A    3/2006
CN  107431492 A   12/2017
(Continued)

OTHER PUBLICATIONS

International Search Report and Written Opinion of PCT Application No. PCT/JP2018/023554, dated Aug. 7, 2018, 07 pages of ISRWO.

(Continued)

*Primary Examiner* — Brian K Young
(74) *Attorney, Agent, or Firm* — Chip Law Group

(57) ABSTRACT

The present technology relates to a signal processing apparatus, a signal processing method, and a program that make it possible to cope with an output of a PCM signal using one DSD signal. A distribution apparatus includes an extraction section that, in a case where a PCM signal having a predetermined sampling frequency is generated from a DSD signal, extracts a predetermined number of samples from the DSD signal around samples at a predetermined interval determined by the predetermined sampling frequency, and a filtering section that generates the PCM signal having the predetermined sampling frequency by filtering the extracted predetermined number of samples. The present technology is applicable to, for example, a distribution apparatus, etc., that distributes the PCM signal to a client apparatus.

11 Claims, 13 Drawing Sheets

(51) Int. Cl.
*G11B 20/10* (2006.01)
*H03M 3/02* (2006.01)
*G11B 20/00* (2006.01)

(52) U.S. Cl.
CPC ........... *H03M 3/02* (2013.01); *H03M 7/3028* (2013.01); *G11B 2020/00065* (2013.01)

(58) Field of Classification Search
USPC .................................................. 341/106, 53
See application file for complete search history.

(56) References Cited

U.S. PATENT DOCUMENTS

| | | | |
|---|---|---|---|
| 9,990,173 B2* | 6/2018 | Hester | G11B 27/038 |
| 10,063,986 B2* | 8/2018 | Kobayashi | H04R 3/12 |
| 10,522,155 B2* | 12/2019 | Kamkar | G10L 19/167 |
| 2004/0174279 A1 | 9/2004 | Heo | |
| 2006/0058901 A1 | 3/2006 | Aida et al. | |
| 2015/0107442 A1 | 4/2015 | Tachimori | |
| 2018/0115322 A1 | 4/2018 | Fukui | |

FOREIGN PATENT DOCUMENTS

| | | |
|---|---|---|
| EP | 1635350 A1 | 3/2006 |
| EP | 3267587 A1 | 1/2018 |
| JP | 2002-328683 A | 11/2002 |
| JP | 2003-208186 A | 7/2003 |
| JP | 2006-079742 A | 3/2006 |
| JP | 2008-141470 A | 6/2008 |
| JP | 5737357 B2 | 6/2015 |
| JP | 6652123 B2 | 2/2020 |
| WO | 2016/140071 A1 | 9/2016 |
| WO | 2016/199596 A1 | 12/2016 |

OTHER PUBLICATIONS

Extended European Search Report of EP Application No. 18828167.9, dated Jun. 17, 2020, 10 pages.

* cited by examiner

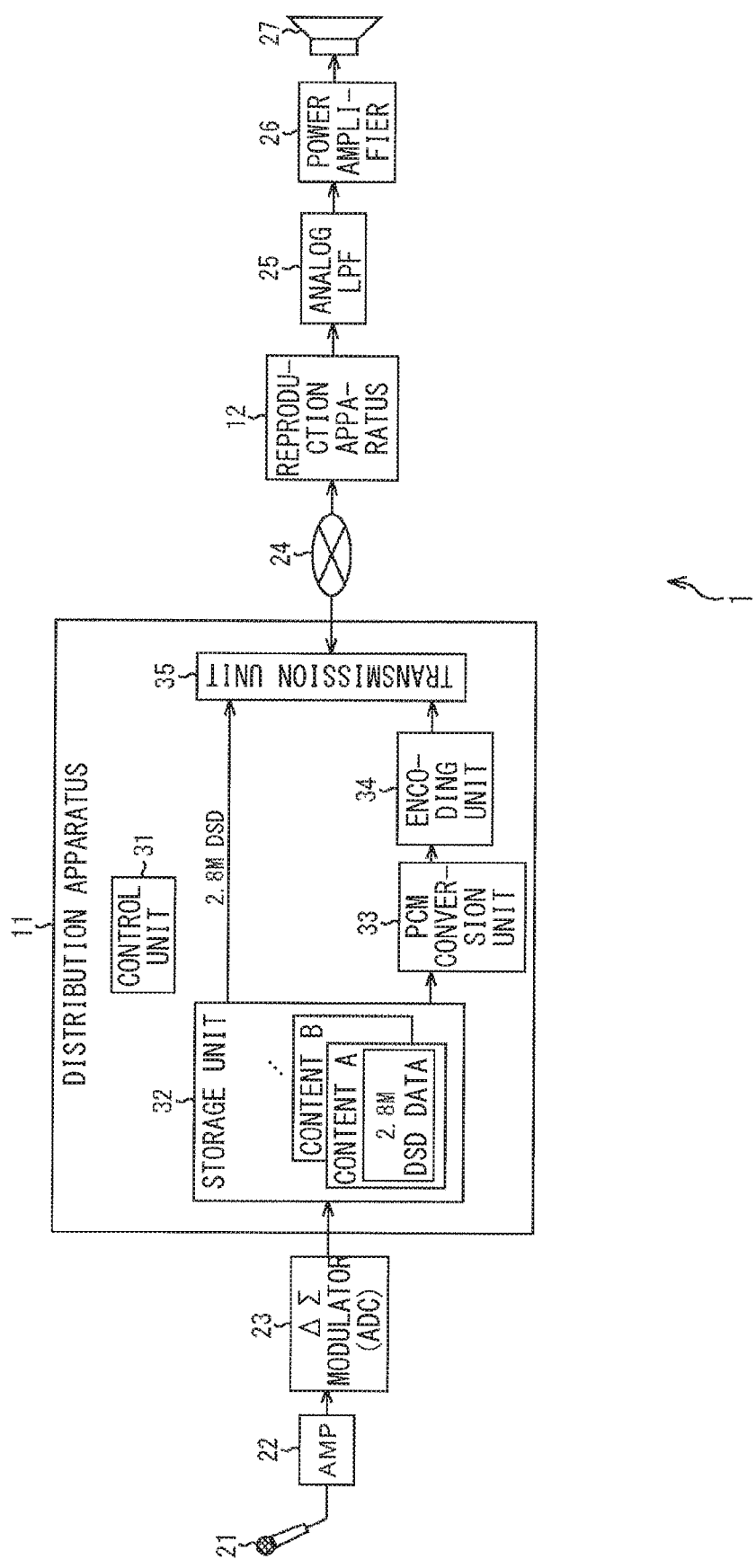
[FIG. 1]

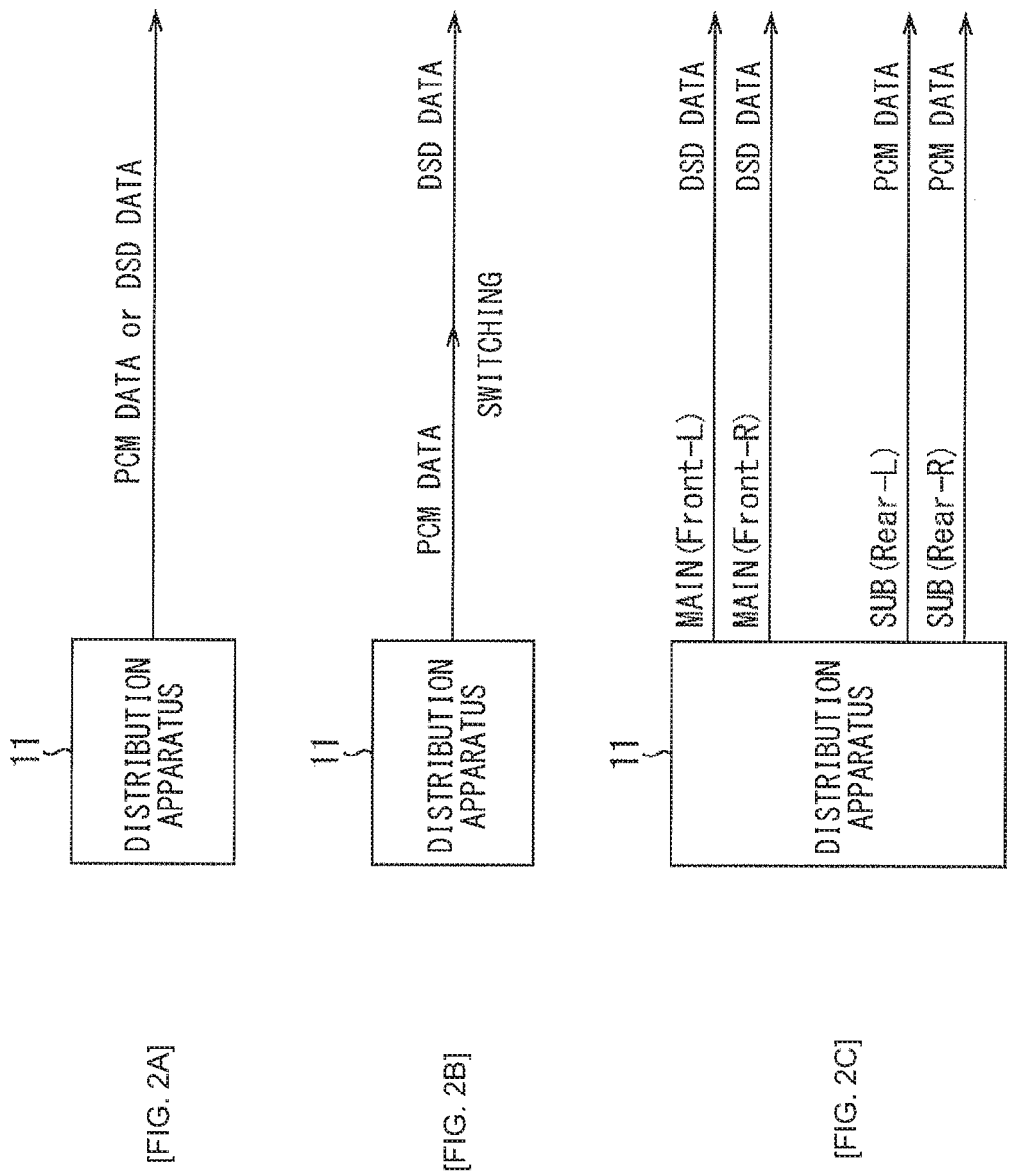

[FIG. 3]
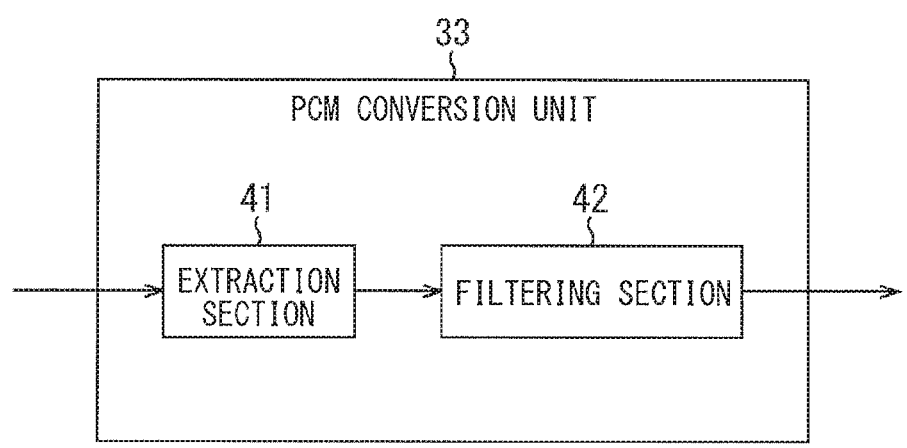

[FIG. 4]

| 192kPCM Data | 14.7×m | CENTER POSITION SAMPLE | DSD Data |
|---|---|---|---|
| PCM[0] | 0 | 0 | D[-127]-D[128] |
| PCM[1] | 14.7 | 15 | D[-112]-D[143] |
| PCM[2] | 29.4 | 29 | D[-98]-D[157] |
| PCM[3] | 44.1 | 44 | D[-83]-D[172] |
| PCM[4] | 58.8 | 59 | D[-68]-D[187] |
| ... | ... | ... | ... |
| ... | ... | ... | ... |
| PCM[100] | 1470 | 1470 | D[1343]-D[1598] |
| PCM[101] | 1484.7 | 1485 | D[1358]-D[1613] |
| PCM[102] | 1499.4 | 1499 | D[1372]-D[1627] |
| PCM[103] | 1514.1 | 1514 | D[1387]-D[1642] |
| ... | ... | ... | ... |

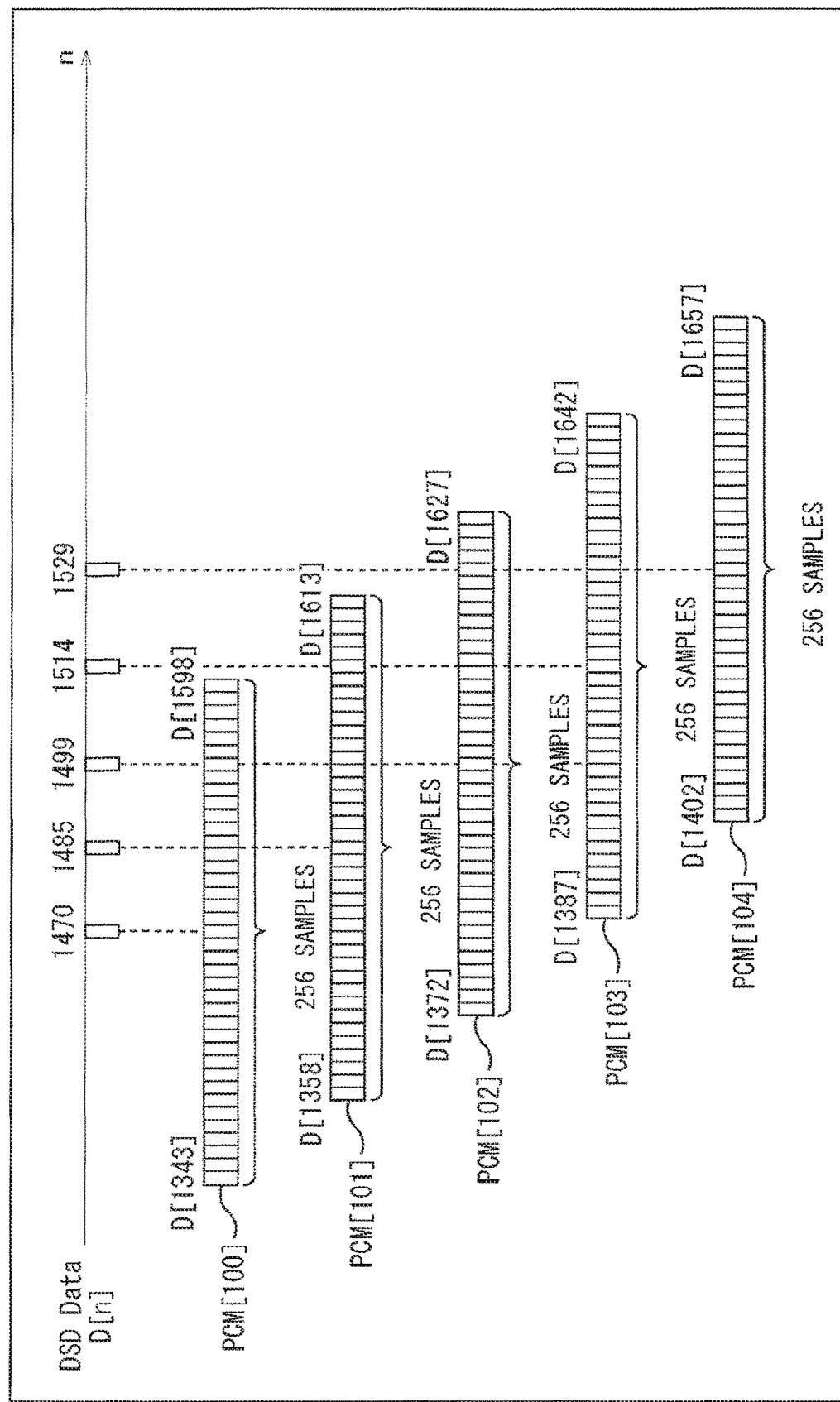
[FIG. 5]

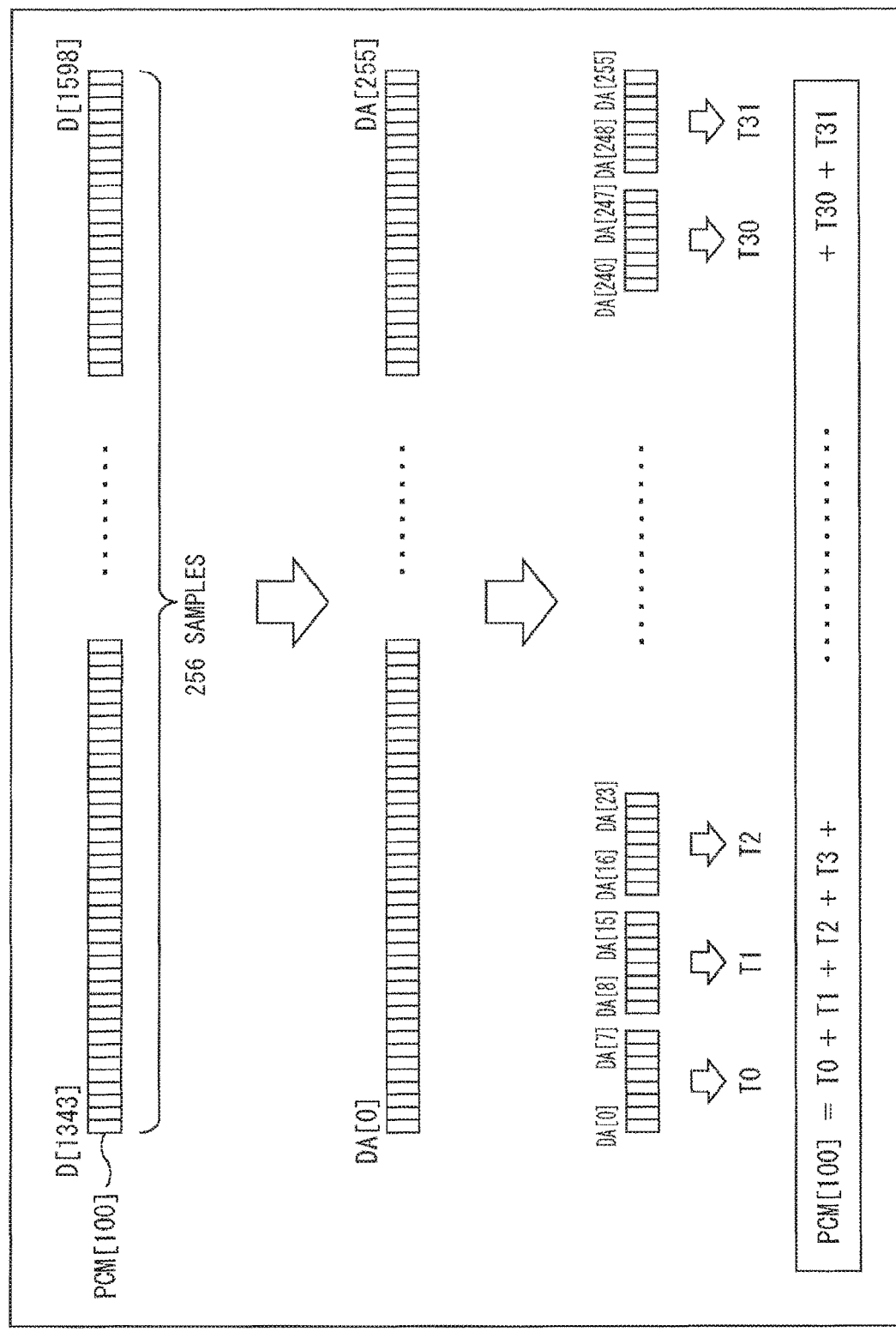
[FIG. 6]

[FIG. 7]

| DA[0] | DA[1] | DA[2] | DA[3] | DA[4] | DA[5] | DA[6] | DA[7] | $\sum DA[n]*K[n]$ (n=0 TO 7) | |
|---|---|---|---|---|---|---|---|---|---|
| 0 | 0 | 0 | 0 | 0 | 0 | 0 | 1 | $C_0$ | |
| 0 | 0 | 0 | 0 | 0 | 0 | 1 | 1 | $C_1$ | |
| ... | ... | ... | ... | ... | ... | ... | ... | ... | → T0 |
| ... | ... | ... | ... | ... | ... | ... | ... | ... | |
| 1 | 1 | 1 | 1 | 1 | 1 | 0 | 1 | $C_{253}$ | |
| 1 | 1 | 1 | 1 | 1 | 1 | 1 | 0 | $C_{254}$ | |
| 1 | 1 | 1 | 1 | 1 | 1 | 1 | 1 | $C_{255}$ | |

BT0

[FIG. 8]
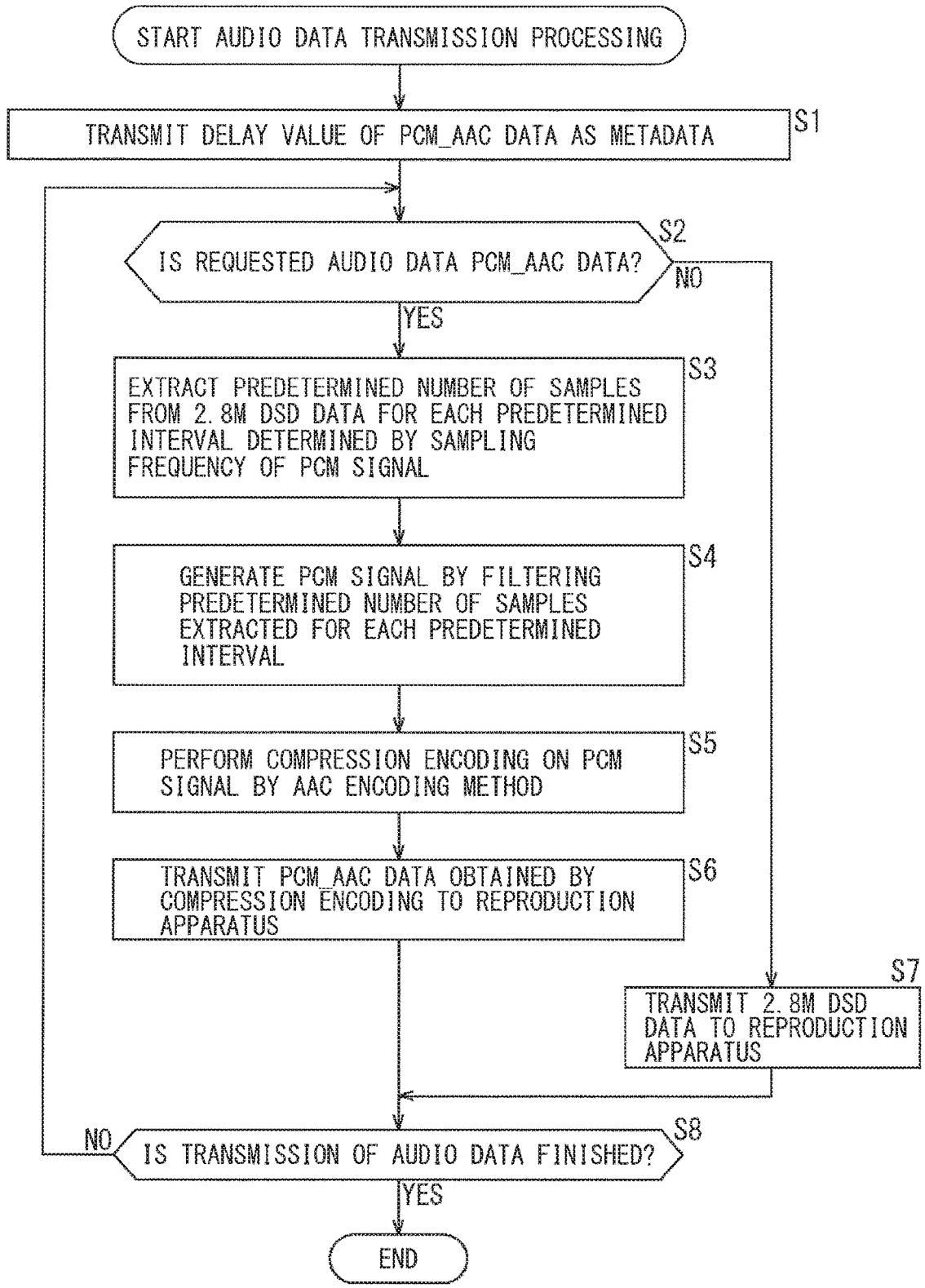

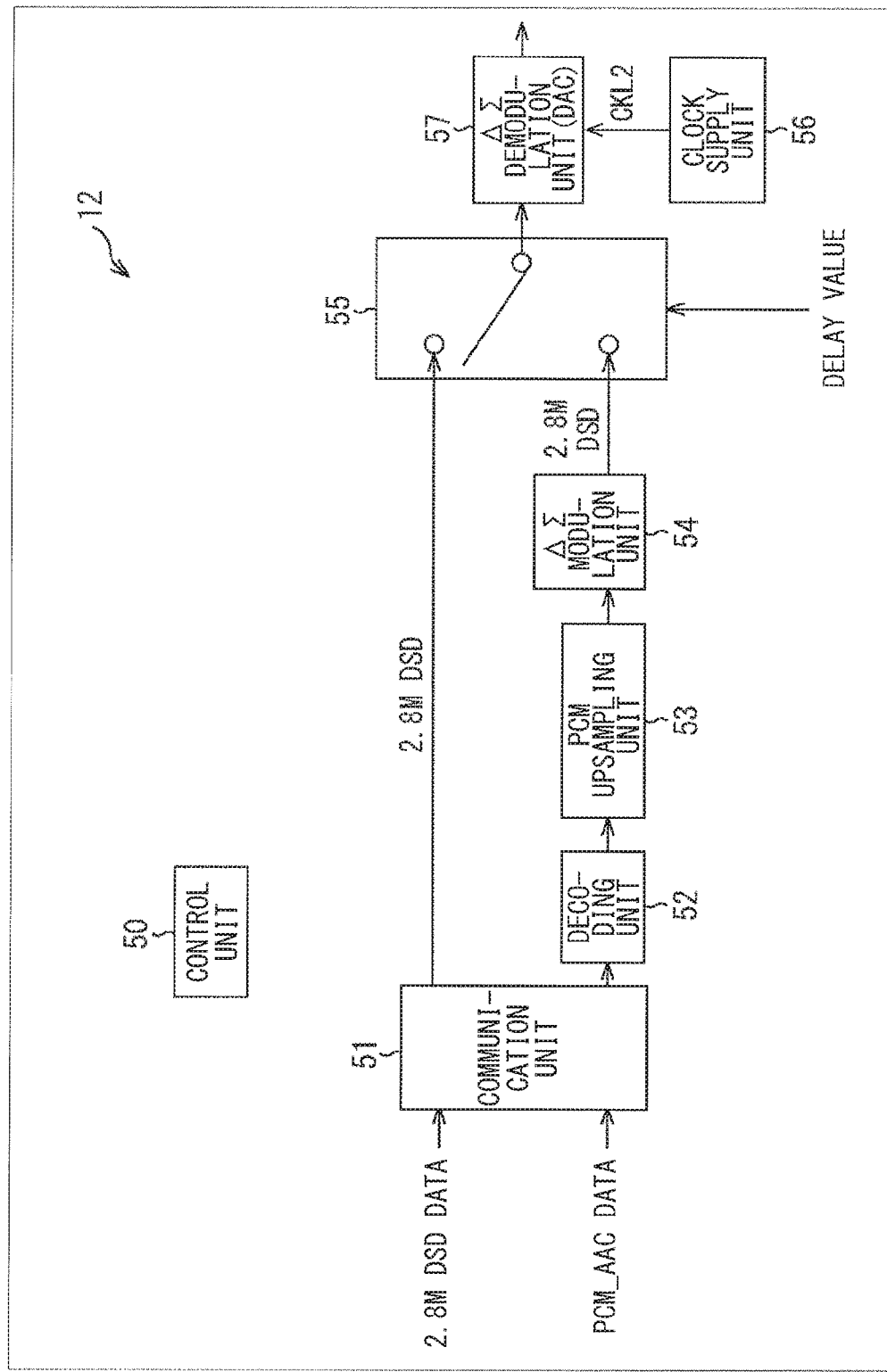
[FIG. 9]

[FIG. 10]
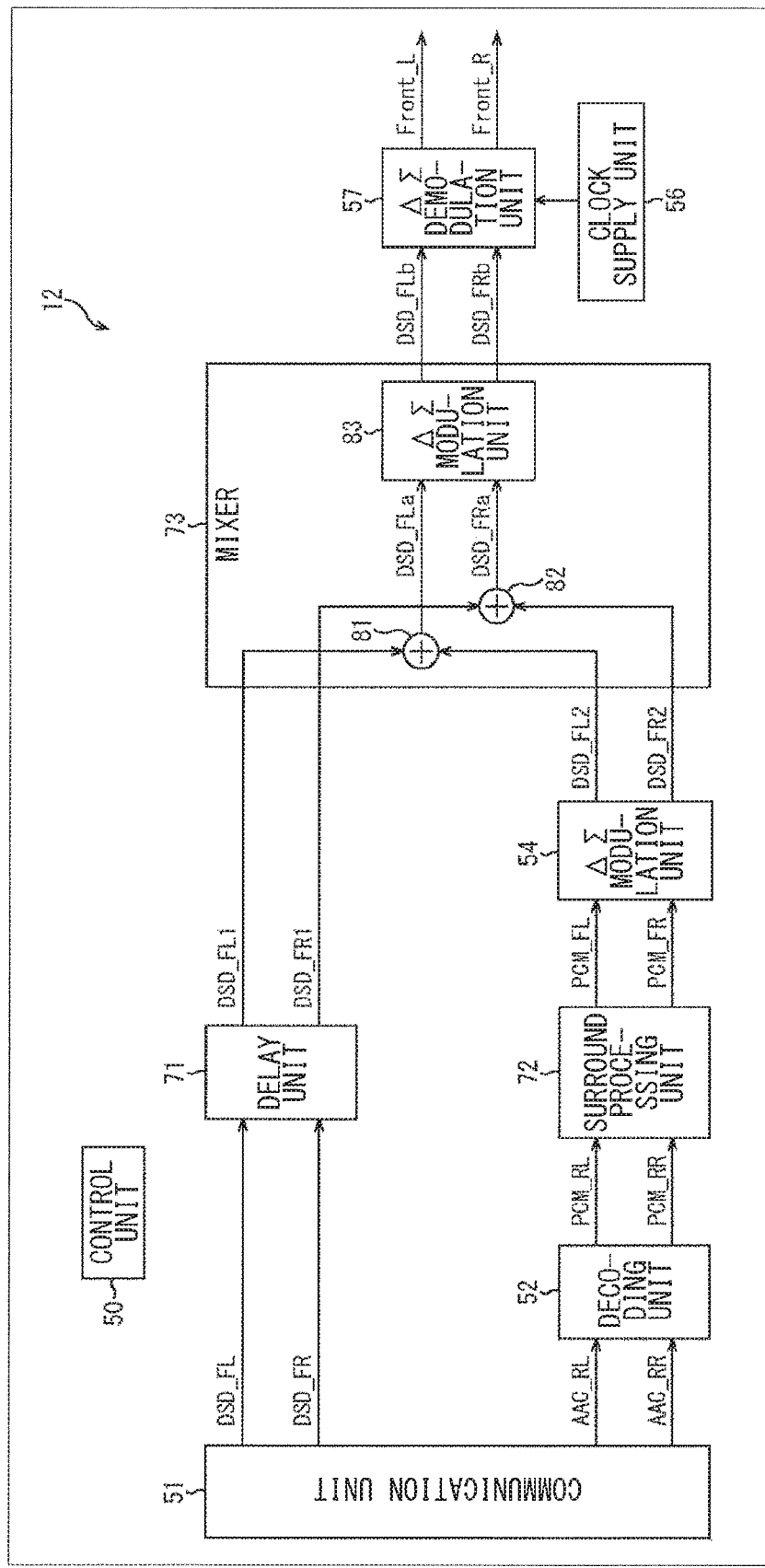

[FIG. 11]
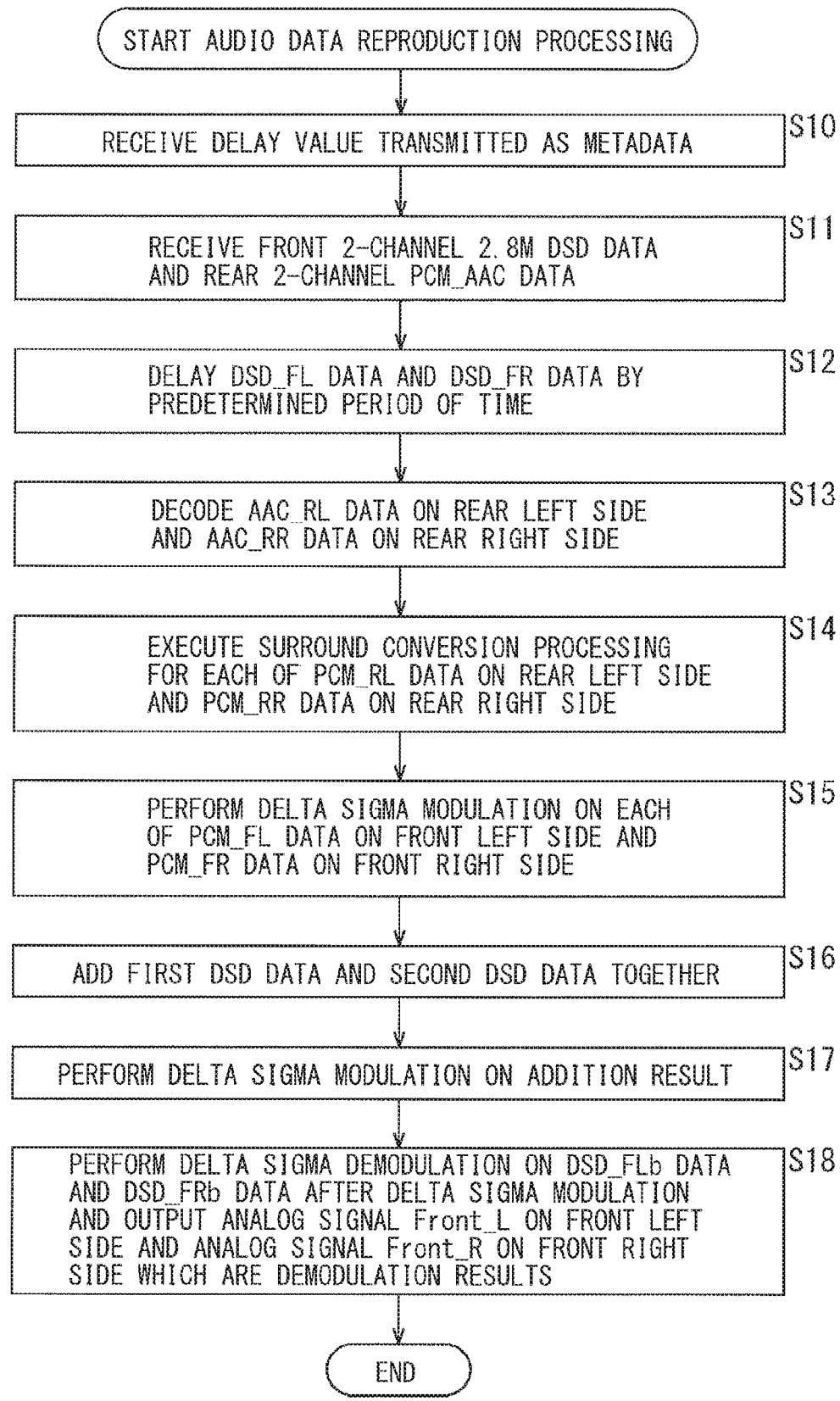

[FIG. 12]
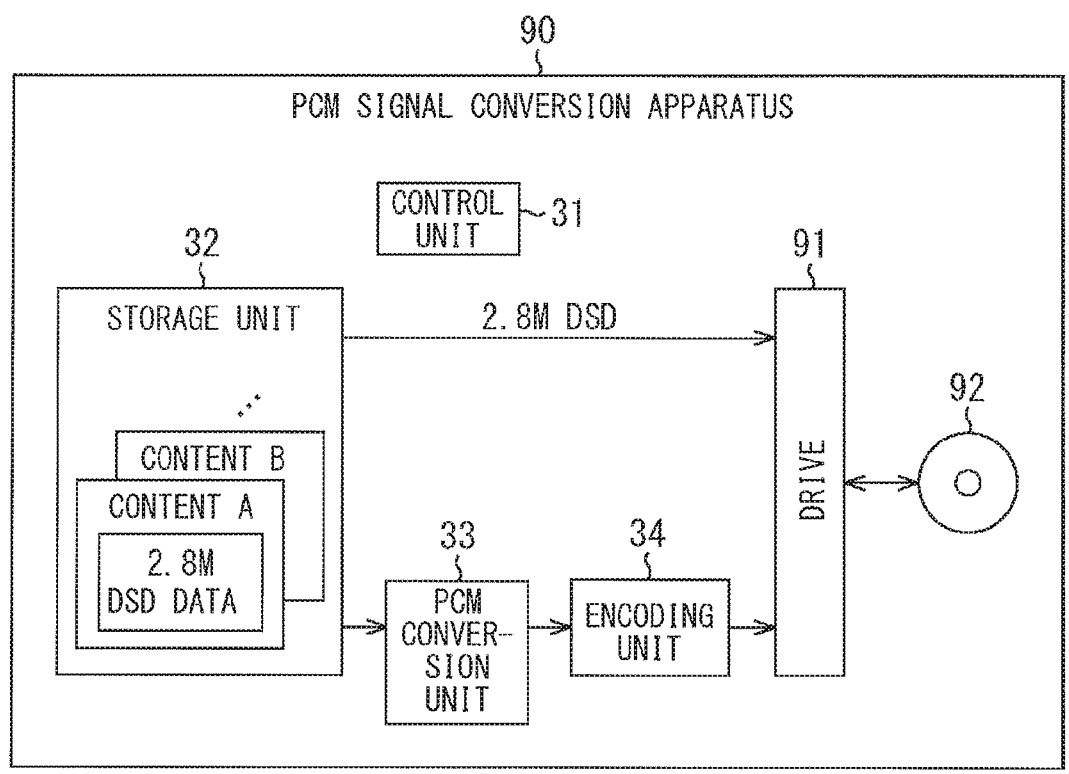

[FIG. 13]
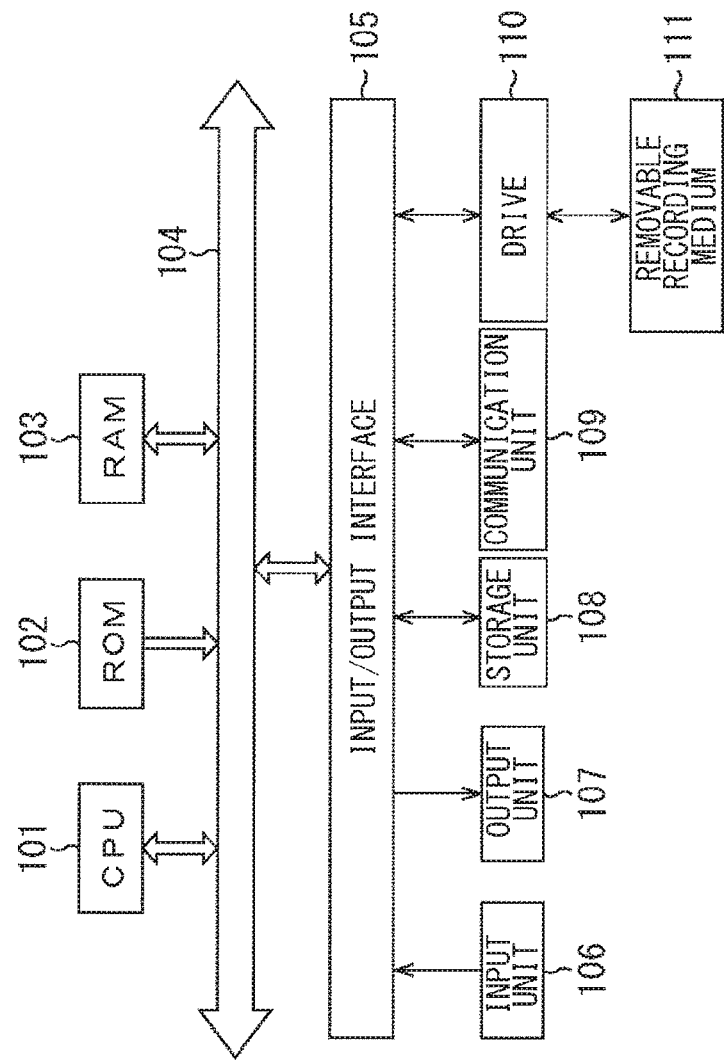

SIGNAL PROCESSING APPARATUS AND SIGNAL PROCESSING METHOD

CROSS REFERENCE TO RELATED APPLICATIONS

This application is a U.S. National Phase of International Patent Application No. PCT/JP2018/023554 filed on Jun. 21, 2018, which claims priority benefit of Japanese Patent Application No. JP 2017-131854 filed in the Japan Patent Office on Jul. 5, 2017. Each of the above-referenced applications is hereby incorporated herein by reference in its entirety.

TECHNICAL FIELD

The present technology relates to a signal processing apparatus, a signal processing method, and a program, and more particularly, to a signal processing apparatus, a signal processing method, and a program that make it possible to cope with an output of a PCM signal using one DSD signal.

BACKGROUND ART

In recent years, music distribution using a high resolution sound source, which is audio data having a sound quality exceeding that of a music CD (CD-DA), has been increasingly performed.

In music distribution using a digital signal delta-sigma-modulated by a 1-bit signal (hereinafter, also referred to as a DSD (Direct Stream Digital) signal), not only a 64 times DSD signal (64DSD signal) with 64 times a sampling frequency of 44.1 kHz of a CD used in a super audio CD (SACD), but also a 128 times DSD signal (128DSD signal) and a 256 times DSD signal (256DSD signal) have been experimentally distributed.

The sampling frequency of the DSD signal is higher than that of a PCM (Pulse Code Modulation) signal, and thus a communication capacity in a case of performing streaming distribution is larger than that of the PCM signal. For example, when one frame is 3 seconds for a stereo (two-channel) signal, a data capacity of the 64-DSD is about 2.8 Mbit per frame.

Therefore, the present applicant has previously proposed, in PTL 1, a compression method in which a DSD signal is losslessly compressed and transmitted.

Meanwhile, as a countermeasure corresponding to a circumstance of a communication path, for example, there is a technique such as MPEG-DASH (Moving Picture Experts Group-Dynamic Adaptive Streaming over HTTP) in which a plurality of pieces of encoded data expressing the same content at different bit rates are stored in a content server, and a client apparatus receives, in a streaming manner, desired encoded data from among the plurality of pieces of encoded data in accordance with a communication capacity of a network.

The present applicant has proposed, in PTL 2, a method of dynamically selecting a better-quality DSD signal for listening in accordance with a capacity of a communication line, from among signals of the same content and different bit-rates, e.g., a 64DSD signal, a 128DSD signal, and a 256DSD signal, by using a streaming method such as the MPEG-DASH, in music distribution using a DSD signal. It is to be noted that even when the DSD signal is compressed by using the compression method, or the like disclosed in Patent Document 1, a bit rate becomes larger than that of the PCM signal, and therefore it is preferable to prepare distribution using the PCM signal as well.

CITATION LIST

Patent Literature

PTL 1: International Publication No. WO2016/140071
PTL 2: International Publication No. WO2016/199596

SUMMARY OF THE INVENTION

Problem to be Solved by the Invention

In order to effectively utilize resources on distribution side, however, it is desirable that data type prepared on the distribution side be one type.

The present technology has been made in view of such a circumstance, and makes it possible to cope with an output of a PCM signal using one DSD signal.

Means for Solving the Problem

A signal processing apparatus according to an aspect of the present technology includes an extraction section that, in a case where a PCM signal having a predetermined sampling frequency is generated from a DSD signal, extracts a predetermined number of samples from the DSD signal around samples at a predetermined interval determined by the predetermined sampling frequency, and a filtering section that generates the PCM signal having the predetermined sampling frequency by filtering the extracted predetermined number of samples.

A signal processing method according to an aspect of the present technology includes causing a signal processing apparatus, which generates a PCM signal having a predetermined sampling frequency from a DSD signal, to extract a predetermined number of samples from the DSD signal around samples at a predetermined interval determined by the predetermined sampling frequency, and generate the PCM signal having the predetermined sampling frequency by filtering the extracted predetermined number of samples.

A program according to an aspect of the present technology causes a computer to execute processing. The processing includes extracting, in a case where a PCM signal having a predetermined sampling frequency is generated from a DSD signal, a predetermined number of samples from the DSD signal around samples at a predetermined interval determined by the predetermined sampling frequency, and generating the PCM signal having the predetermined sampling frequency by filtering the extracted predetermined number of samples.

In an aspect of the present technology, in a case where a PCM signal having a predetermined sampling frequency is generated from a DSD signal, a predetermined number of samples are extracted from the DSD signal around samples at a predetermined interval determined by the predetermined sampling frequency, and the PCM signal having the predetermined sampling frequency is generated by filtering the extracted predetermined number of samples.

It is to be noted that it is possible to achieve the signal processing apparatus according to an aspect of the present technology by causing the computer to execute the program.

It is possible to provide the program by transmission via a transmission medium or by recording in a recording medium.

The signal processing apparatus may be an independent apparatus or may be an internal block that constitutes one apparatus.

Effect of the Invention

According to an aspect of the present technology, it is possible to cope with the output of the PCM signal using one DSD signal.

It is to be note that the effects described here are not necessarily limitative, and may be any of the effects described in the present disclosure.

BRIEF DESCRIPTION OF THE DRAWINGS

FIG. 1 is a block diagram illustrating a configuration example of an embodiment of a reproduction system to which the present technology is applied. FIGS. 2A, 2B, and 2C are explanatory diagrams of a transmission mode of audio data transmitted by a distribution apparatus.

FIG. 3 is a block diagram illustrating a detailed configuration example of a PCM conversion unit.

FIG. 4 is an explanatory diagram of sampling extraction processing.

FIG. 5 is an explanatory diagram of the sampling extraction processing.

FIG. 6 is an explanatory diagram of filtering processing.

FIG. 7 is an explanatory diagram of the filtering processing.

FIG. 8 is a flowchart that describes audio data transmission processing.

FIG. 9 is a block diagram illustrating a detailed configuration example of a reproduction apparatus.

FIG. 10 is a block diagram illustrating a configuration example of the reproduction apparatus.

FIG. 11 is a flowchart that describes audio data reproduction processing.

FIG. 12 is a block diagram illustrating a configuration example of an embodiment of a PCM signal conversion apparatus to which the present technology is applied.

FIG. 13 is a block diagram illustrating a configuration example of an embodiment of a computer to which the present technology is applied.

MODES FOR CARRYING OUT THE INVENTION

Hereinafter, description is given of an embodiment for carrying out the present technology (hereinafter, referred to as an embodiment). It is to be noted that the description is given in the following order.
1. Configuration Example of Reproduction System
2. Transmission Mode of Reproduced Audio Data
3. Detailed Configuration Example of PCM Conversion Unit
4. Description of PCM Conversion Processing
5. Audio Data Transmission Processing
6. Detailed Configuration Example of Reproduction Apparatus
7. Mode for Simultaneous Transmission of DSD Data and PCM_AAC Data
8. Audio Data Reproduction Processing
9. PCM Signal Conversion Apparatus
10. Computer Configuration Example
<1. Configuration Example of Reproduction System>

FIG. 1 is a block diagram illustrating a configuration example of a reproduction system to which the present technology is applied.

A reproduction system 1 of FIG. 1 includes at least a distribution apparatus 11 and a reproduction apparatus 12, and is a system in which the reproduction apparatus 12 acquires audio data from the distribution apparatus 11 and reproduces the acquired audio data.

Audio data obtained by collecting respective sound sources of a plurality of contents by a microphone 21 and by performing delta-sigma modulation is stored in the distribution apparatus 11.

More specifically, an audio signal of a predetermined sound source (e.g., content A) collected by the microphone 21 is amplified by an amplifier (AMP) 22 and supplied to a delta-sigma (ΔΣ) modulator 23.

The delta-sigma modulator 23 converts an inputted analog audio signal into a digital signal (AD conversion) by delta-sigma modulation. For example, the delta-sigma modulator 23 preforms delta-sigma modulation on the inputted analog audio signal at a sampling frequency that is 64 times a sampling frequency of 44.1 kHz of a CD (Compact Disc), and stores a resulting DSD signal in the distribution apparatus 11. The DSD signal obtained by the delta-sigma modulation at the sampling frequency that is 64 times the sampling frequency of 44.1 kHz has a bit rate of 2.8 MMbps, and thus is also referred to as 2.8 M DSD data in the following.

The distribution apparatus 11 stores the 2.8 M DSD data of a plurality of contents generated as described above.

When requesting audio data of a predetermined content from the distribution apparatus 11, the reproduction apparatus 12 selects either the 2.8 M DSD data or PCM_AAC data that is audio data of a format reproducible by itself, and requests the selected data from the distribution apparatus 11. Alternatively, the reproduction apparatus 12 may select either the 2.8 M DSD data or the PCM_AAC data in accordance with a communication capacity of a network 24, and request the selected data from the distribution apparatus 11.

Here, the PCM_AAC data is a signal obtained by compression encoding on a PCM signal having a sampling frequency of 192 kHz (44.1 k×4 Hz) and a quantization bit of 16 bits by an encoding method of AAC (Advanced Audio Coding).

The distribution apparatus 11 transmits the 2.8 M DSD data or the PCM_AAC data of a specified content to the reproduction apparatus 12 in response to a request of the reproduction apparatus 12.

The distribution apparatus 11 includes a control unit 31, a storage unit 32, a PCM conversion unit 33, an encoding unit 34, and a transmission unit 35.

The control unit 31 acquires a content transmission request of the reproduction apparatus 12 via the transmission unit 35, and so controls each unit in the distribution apparatus 11 as to transmit audio data of a requested content.

More specifically, for example, in a case where the reproduction apparatus 12 requests 2.8 M DSD data as audio data of the content A, the control unit 31 causes the transmission unit 35 to supply the 2.8 M DSD data of the content A stored in the storage unit 32, and causes the transmission unit 35 to transmit the 2.8 M DSD data to the reproduction apparatus 12.

For example, in a case where the reproduction apparatus 12 requests PCM_AAC data as the audio data of the content A, the control unit 31 operates the PCM conversion unit 33 and the encoding unit 34 to generate the PCM_AAC data from the 2.8 M DSD data of the content A stored in the storage unit 32, and causes the transmission unit 35 to transmit the generated PCM_AAC data to the reproduction apparatus 12.

The storage unit 32 stores 2.8 M DSD data of each of a plurality of contents.

The PCM conversion unit 33 converts the 2.8 M DSD data supplied from the storage unit 32 into a PCM signal having a sampling frequency of 192 kHz and a quantization bit of 16 bits, thereby generating a PCM signal and supplying the generated PCM signal to the encoding unit 34. It is to be noted that the sampling frequency and the quantization bit number of the PCM signal to be generated are exemplary, and are not limitative.

The encoding unit 34 performs compression encoding on the PCM signal supplied from the PCM conversion unit 33 by an encoding method of AAC (Advanced Audio Coding), and supplies a resulting PCM_AAC data to the transmission unit 35.

The transmission unit 35 receives a transmission request for audio data transmitted from the reproduction apparatus 12 via the network 24, and supplies the transmission request to the control unit 31.

In addition, the transmission unit 35 transmits the audio data of the predetermined content supplied from the storage unit 32 or the encoding unit 34 to the reproduction apparatus 12 via the network 24. The 2.8 M DSD data is supplied as audio data from the storage unit 32, and the PCM_AAC data is supplied from the encoding unit 34.

The reproduction apparatus 12 receives digital audio data transmitted from the distribution apparatus 11, converts the received digital audio data into an analog signal, and outputs the converted analog signal to an analog LPF 25.

The analog LPF (low pass filter) 25 performs filter processing to remove a high-frequency component, and outputs a signal after the filter processing to a power amplifier 26.

The power amplifier 26 amplifies an analog audio signal outputted from the analog LPF 25, and outputs the amplified analog audio signal to a speaker 27. The speaker 27 outputs the audio signal supplied from the power amplifier 26 as a sound.

An analog output portion configured by the analog LPF 25, the power amplifier 26, and the speaker 27 may be incorporated as a portion of the reproduction apparatus 12.

<2. Transmission Mode of Reproduced Audio Data>

FIGS. 2A, 2B, and 2C illustrate a transmission mode of audio data transmitted by the distribution apparatus 11 to the reproduction apparatus 12.

The transmission mode of the audio data transmitted by the distribution apparatus 11 to the reproduction apparatus 12 may take several forms depending on the configuration of the reproduction apparatus 12.

For example, in a case where audio data reproducible by the reproduction apparatus 12 is fixed by either 2.8 M DSD data or PCM_AAC data, the distribution apparatus 11 transmits either the 2.8 M DSD data or the PCM_AAC data reproducible by the reproduction apparatus 12, as illustrated in FIG. 2A. In a case where a data format of the audio data reproducible by the reproduction apparatus 12 is known, only a content to be reproduced is designated from the reproduction apparatus 12 to the distribution apparatus 11. It is to be noted that, in FIGS. 2A, 2B, and 2C, for simplicity, the 2.8 M DSD data is described as DSD data, and the PCM_AAC data is described as PCM data.

Further, for example, in a case where the reproduction apparatus 12 is an apparatus that is able to reproduce 2.8 M DSD data and PCM_AAC data of the same content while performing switching between them as necessary even during reproduction of one content, the distribution apparatus 11 performs seamless switching between 2.8 M DSD data and PCM_AAC data of the same content for transmission in response to a request of the reproduction apparatus 12, as illustrated in FIG. 2B. The 2.8 M DSD data has a higher sound quality but a larger data amount, and the PCM_AAC data has a lower sound quality but a smaller data amount than the 2.8 M DSD data. Accordingly, for example, the reproduction apparatus 12 appropriately selects the 2.8 M DSD data or the PCM_AAC data in accordance with the communication capacity of the network 24, and reproduction the selected data while performing switching.

It is to be noted that, in a case of seamlessly reproducing the 2.8 M DSD data and the PCM_AAC data while performing switching between them, a delay occurs in the PCM_AAC data by a period of time required for PCM data conversion processing by the PCM conversion unit 33 and a period of time required for compression encoding processing by the encoding unit 34. The distribution apparatus 11 is able to transmit this delay value as metadata to the reproduction apparatus 12 in advance, thus enabling the reproduction apparatus 12 to perform seamless switching between 2.8 M DSD data and PCM_AAC data on the basis of the delay value.

There is MPEG-DASH (Moving Picture Experts Group-Dynamic Adaptive Streaming over HTTP), as a standard of a method in which a client apparatus receives desired encoded data, from among a plurality of pieces of stored encoded data, in a streaming manner in accordance with the communication capacity of the network. The distribution apparatus 11 performs switching between the 2.8 M DSD data and the PCM_AAC data as necessary for transmission in accordance with a format conforming to the MPEG-DASH standard, and the reproduction apparatus 12 receives the transmitted data and reproduces the received data.

The distribution apparatus 11 is also able to transmit both of the 2.8 M DSD data and the PCM_AAC data simultaneously. For example, as illustrated in FIG. 2C, it is possible for audio data on front right side and front left side to be transmitted as 2.8 M DSD data having a high sound quality, and audio data on rear right side and rear left side to be transmitted as PCM_AAC data having a small data amount.

As described above, the distribution apparatus 11 is able to cope with transmission of both of the 2.8 M DSD data and the PCM_AAC data by simply storing, as audio data for distribution, one piece of DSD data of the 2.8 M DSD data.

<3. Detailed Configuration Example of PCM Conversion Unit>

FIG. 3 is a block diagram illustrating a detailed configuration example of the PCM conversion unit 33.

The PCM conversion unit 33 includes an extraction section 41 and a filtering section 42, and converts the 2.8 M DSD data into a PCM signal having a predetermined sampling frequency. In the present embodiment, the PCM conversion unit 33 performs conversion into a PCM signal having a sampling frequency of 192 kHz.

The extraction section 41 extracts a predetermined number of sampling data from the 2.8 M DSD data supplied from the storage unit 32 for each predetermined interval determined by the sampling frequency of 192 KHz of the PCM signal.

The filtering section 42 generates a PCM signal by filtering the predetermined number of sampling data extracted for each predetermined interval in the extraction section 41, and outputs the generated PCM signal to the encoding unit 34.

<4. Description of PCM Conversion Processing>

Description is given of PCM conversion processing performed by the PCM conversion unit 33 with reference to FIGS. 4 to 7.

(Sampling Extraction Processing by Extraction Section 41)

First, description is given of sampling extraction processing performed by the extraction section 41 with reference to FIGS. 4 and 5.

Now, respective pieces of sampled data of 2.8 M DSD data of a predetermined content before PCM conversion are set as:

D[0], D[1], D[2], D[3], . . . , D[n], . . . , and respective pieces of sampled data of PCM data after the PCM conversion are set as:

PCM[0], PCM[1], PCM[2], PCM[3], . . . , PCM[n], . . . .

The sampled data D[n] of the 2.8 M DSD data is represented by a 1-bit signal of "1" or "0"; however, in an operation in signal processing, "0" is represented by "−1", and operation is performed using "1" or "−1". It is to be noted that, in the following, the sampling data is simply referred to also as a sample.

One sample of the 2.8 M DSD data is $1/(44.1*64\,k)$ [sec], and one sample of the PCM data having a sampling frequency of 192 kHz is $1/192\,k$ [sec], and thus the PCM conversion unit 33 outputs data for each of $(44.1*64)/192=14.7$ samples.

Accordingly, the extraction section 41 extracts a predetermined number of samples from samples of the 2.8 M DSD data at an interval of 14.7 samples. In the present embodiment, the number of samples extracted by the extraction section 41 is set to 256. Accordingly, the extraction section 41 extracts 256 samples in the vicinity of the 2.8 M DSD data sample to allow each sample position of m times (m is a non-negative integer) the 14.7 samples to be the center sample, and supplies the extracted samples to the filtering section 42.

FIG. 4 illustrates a correspondence relationship between the samples of the 2.8 M DSD data extracted by the extraction section 41 and the PCM data PCM[n] after the PCM conversion.

The m times the 14.7 samples are 0, 14.7, 29.4, 44.1, 58.5, . . . , 1470, 1484.7, 1499.4, 1514.1, . . . , and thus the center position samples of the extracted samples corresponding to respective pieces of PCM[n] are 0, 15, 29, 44, 59, . . . , 1470, 1485, 1499, 1514, . . . .

Then, the 256 samples are extracted from around respective center position samples, and thus the extracted samples corresponding to PCM[0] are D[−127] to D[128] around D[0], the extracted samples corresponding to PCM[1] are D[−112] to D[143] around D[15], and the extracted samples corresponding to PCM[2] are D[−98] to D[157] around D[29]. However, D"n" in which n is negative is processed as "−1" because of lack of data of the content.

As an instance of not including the D"n" in which n is negative, for example, as illustrated in FIG. 4, the extracted samples corresponding to PCM[100] are D[1343] to D[1598] around D[1470], the extracted samples corresponding to PCM[101] are D[1358] to D[1613] around D[1485], and the extracted samples corresponding to PCM[102] are D[1372] to D[1627] around D[1499].

FIG. 5 illustrates a relationship between the center position sample of the 2.8 M DSD data and the 256 samples to be extracted, for each of PCM[100] to PCM[104].

The maximum error between the predetermined interval determined by the sampling frequency of the PCM signal and the center position sample to be actually extracted is half a sampling period of the DSD signal, and thus the maximum error is $0.5/(44.1\,k*64)=0.18$ [μsec] for the case of the 2.8 M DSD data. Time resolution of human hearing is said to be about 5 [μsec]; frequency conversion of 0.18 [μsec] is 5.6 MHz, and frequency conversion of 5 [μsec] is 200 kHz, and thus an error of 0.18 [μsec] does not constitute an error that greatly influences a sound quality.

As described above, the extraction section 41 extracts a predetermined number of samples (256 samples) from the samples of the 2.8 M DSD data supplied from the storage unit 32 around a predetermined interval (14.7 samples) determined by the sampling frequency of 192 KHz of the PCM signal, and outputs the extracted samples to the filtering section 42.

Although the example described above is an example in which the 2.8 M DSD data is converted into the PCM signal having the sampling frequency of 192 kHz, it is possible to perform the conversion into a PCM signal having any sampling frequency. In addition, the DSD data is not limited to the 2.8 M DSD data; 5.6 M DSD data having a sampling frequency that is twice the 2.8 M DSD data, 11.2 M DSD data having a sampling frequency that is four times the 2.8 M DSD data, or the like may be used. In a case where the bit rate of the DSD data or the sampling frequency of the PCM signal changes, it is possible to cope with the change only by changing the interval between the center position samples in accordance with its sampling ratio.

Further, it is possible to arbitrarily determine the number of samples to be extracted from around the center position sample, in accordance with accuracy of the PCM signal to be converted and the processing load.

(Filtering Processing by Filtering Section 42)

Next, description is given of filtering processing performed by the filtering section 42 with reference to FIGS. 6 and 7.

The 2.8 M DSD data is a binary signal of "1" or "0" ("1" or "−1" for the operation in the signal processing) as described above, and thus it is possible for the filtering section 42 to execute the filtering processing only by addition instead of product-sum operation as in the filtering of the normal PCM signal.

Now, assuming that the 256 samples extracted from around the predetermined center position samples supplied from the extraction section 41 are represented by DA[0] to DA[255], and filter coefficients of 256 taps applied by the filtering section 42 to DA[0] to DA[255] are K[0] to K[255], a filter operation performed by the filtering section 42 is represented by $\Sigma DA[n]*K[n]$ (n=0 to 255). Here, DA[n] is "1" or "−1", and thus it is easily understood that it is possible to perform an operation of the filter operation expression only by addition without the need for multiplication.

Although the addition may be performed by detecting data bit by bit, the data becomes redundant as processing of CPU, and thus, for example, the filtering section 42 divides the 256-bit data of DA[0] to DA[255] for each 8 bits, and performs an operation using a plurality of partial sum tables prepared in advance in a unit of 8 bits.

For example, description is given of an example in which D[1343] to D[1598] which are extracted samples corresponding to the PCM[100] are subjected to the filter operation, as illustrated in FIG. 6.

First, D[1343] to D[1598] supplied from the extraction section 41 as extracted samples corresponding to the PCM [100] are DA[0] to DA[255] which are data to be filtered.

DA[0] to DA[255] are divided for each 8 bits of DA[0] to DA[7], DA[8] to DA[15], DA[16] to DA[23], . . . , DA[240] to DA[247], and DA[248] to DA[255].

The filtering section 42 holds a partial sum table BT0 illustrated in FIG. 7 for the first 8 bits DA[0] to DA[7].

The partial sum table BT0 of FIG. 7 associates 256 patterns of bit patterns employable by DA[0] to DA[7] and operation results $C_0$ to $C_{255}$ resulting from a preliminary operation of $\Sigma DA[n]*K[n]$ (n=0 to 7) at that time, each other, for storage.

The filtering section 42 refers to the partial sum table BT0 of FIG. 7 stored therein and determines the operation result corresponding to the actual data of DA[0] to DA[7] to thereby calculate a partial sum T0. The partial sum T0 is any one of $C_0$ to $C_{255}$.

Returning to FIG. 6, the filtering section 42 similarly refers to partial sum tables BT1 to BT31 to thereby determine partial sums T1 to T31, for DA[8] to DA[15], DA[16] to DA[23], . . . , DA[240] to DA[247], and DA[248] to DA[255], which are other data divided for each 8 bits.

That is, the filtering section 42 refers to the partial sum table BT1 to calculate the partial sum T1 corresponding to the actual data of DA[8] to DA[15]; refers to the partial sum table BT2 to calculate the partial sum T2 corresponding to the actual data of DA[16] to DA[23]; and similarly refers to the partial sum table BT31 to calculate the partial sum T31 corresponding to the actual data of DA[248] to DA[255].

Finally, the filtering section 42 performs an operation of sum of the partial sums T0 to T31 corresponding to the 32 partial sum tables BT0 to BT31, respectively, and calculates PCM[100].

Accordingly, the filtering section 42 is able to calculate the PCM data corresponding to the extracted samples D[1343] to D[1598] only by 32 table references and 32 additions.

It is to be noted that a delay value of transmission data with respect to the DSD data in a case where the PCM data is transmitted is able to be calculated in advance when the number of taps of the filtering section 42 is determined.

In the above-described example, in order to simplify the description, the example has been described in which 256 samples are extracted from around respective center position samples in the extraction section 41 and the number of taps of the filtering section 42 is set to 256.

Actually, in a case where a PCM signal having a sampling frequency of 192 kHz with accuracy of, for example, about 100 [dB] is generated from the 2.8 M DSD data, the number of taps of the filtering section 42 needs to be about 4500. In this case, creating a partial sum table in a unit of 12 bits enables an operation only by 375 table references and 375 additions. Assuming that the addition is one clock, 192 k*375=72 MIPS holds true, which is a level that is processible even by a mobile-based CPU and is sufficiently achievable.

<5. Audio Data Transmission Processing>

Next, with reference to a flowchart of FIG. 8, description is given of audio data transmission processing of the distribution apparatus 11 that performs seamless switching between the 2.8 M DSD data and the PCM_AAC data of a predetermined content for transmission in response to a request of the reproduction apparatus 12.

First, in step S1, the control unit 31 of the distribution apparatus 11 supplies a delay value of the PCM_AAC data to the transmission unit 35, and causes the transmission unit 35 to transmit the delay value as metadata to the reproduction apparatus 12.

In step S2, the control unit 31 receives, via the transmission unit 35, the transmission request of the content transmitted from the reproduction apparatus 12, and determines whether the audio data of the requested content is PCM_AAC data.

In a case where, determination is made in step S2 that the requested audio data is PCM_AAC data, the processing proceeds to step S3, in which the extraction section 41 of the PCM conversion unit 33 acquires 2.8 M DSD data of the requested content from the storage unit 32, and extracts a predetermined number of samples from the acquired 2.8 M DSD data for each predetermined interval determined by a sampling frequency of the PCM signal. In the present embodiment, in a case where a PCM signal having a sampling frequency of 192 kHz is generated, 256 samples having each sample corresponding to m times the 14.7 samples as the center position sample are sequentially extracted.

In step S4, the filtering section 42 generates a PCM signal by filtering a predetermined number of samples extracted for each predetermined interval in the extraction section 41, and outputs the generated PCM signal to the encoding unit 34. In the present embodiment, the filtering section 42 generates one sample of the PCM signal by performing 32 table references and 32 additions for the 256 samples supplied from the extraction section 41 using 32 partial sum tables BT0 to BT31, and outputs the generated one sample of the PCM signal to the encoding unit 34.

In step S5, the encoding unit 34 performs compression encoding on the PCM signal supplied from the filtering section 42 by the AAC encoding method, and supplies the resulting PCM_AAC data to the transmission unit 35.

In step S6, the transmission unit 35 transmits the PCM_AAC data obtained by the compression encoding in the encoding unit 34 to the reproduction apparatus 12.

Meanwhile, in a case where determination is made in step S2 that the requested audio data is not PCM_AAC data, i.e., the requested audio data is 2.8 M DSD data, the processing proceeds to step S7, in which the transmission unit 35 acquires 2.8 M DSD data of the requested content from the storage unit 32, and transmits the acquired 2.8 M DSD data to the reproduction apparatus 12.

In step S8, the transmission unit 35 determines whether the transmission of the audio data is finished. For example, in a case where no audio data has been supplied from either the storage unit 32 or the encoding unit 34, the transmission unit 35 determines that the transmission of the audio data has been finished.

In a case where determination is made in step S8 that the transmission of the audio data has not been finished yet, the processing returns to step S2, and the processing from steps S2 to S8 described above is repeated.

Meanwhile, in a case where determination is made in step S8 that the transmission of the audio data has been finished, the audio data transmission processing is finished.

As described above, in a case where PCM_AAC data is requested as audio data of a content from the reproduction apparatus 12, the distribution apparatus 11 is able to generate a PCM signal from the 2.8 M DSD data stored in the storage unit 32 and to transmit the generated PCM signal to the reproduction apparatus 12. That is, the distribution apparatus 11 is able to transmit audio data of one content by performing switching between the DSD data and the PCM_AAC data in response to a request of the reproduction apparatus 12.

In addition, the distribution apparatus 11 transmits, as a delay value, a period of time required for the conversion processing for conversion into the PCM signal to the reproduction apparatus 12 in advance, enabling achievement of complete synchronization of the DSD data and the PCM_AAC data, thus making it possible for side of the reproduction apparatus 12 to perform seamless switching between the DSD data and the PCM_AAC data for reproduction.

For example, in a distribution apparatus that transmits predetermined encoded data in response to a request of a client apparatus, as in the MPEG-DASH, it is generally necessary to generate and store encoded data of both of the DSD signal and the PCM signal in advance by synchronizing the sampling frequencies.

According to the distribution apparatus 11 using the present technology, it is sufficient to store only the DSD data in the storage unit 32 as the audio data of the content, thus making it possible to cope with the transmission of the PCM signal only using one DSD signal.

It is to be noted that the storage unit 32 of the distribution apparatus 11 may store 11.2 M DSD data resulting from delta-sigma modulation at a sampling frequency that is 256 times the sampling frequency of 44.1 kHz of a CD, thus making it possible to configure the distribution apparatus 11 to generate 5.6 M DSD data or 2.8 M DSD data by downsampling from the 11.2 M DSD data and to transmit the generated DSD data, or to generate a PCM signal having any sampling frequency such as 44.1 kHz or 48 kHz from the 11.2 M DSD data and to transmit the generated PCM signal.

It is to be noted that the audio data transmission processing described above is a processing example in the case of the audio data transmission mode illustrated in FIG. 2B. In the audio data transmission mode illustrated in FIG. 2A, in a case where PCM_AAC data is transmitted, it is sufficient to execute the processing from steps S3 to S6, and in a case where 2.8 M DSD data is transmitted, it is sufficient to execute the processing of step S7.

<6. Detailed Configuration Example of Reproduction Apparatus>

FIG. 9 is a block diagram illustrating a detailed configuration example of the reproduction apparatus 12 of FIG. 1.

The reproduction apparatus 12 of FIG. 9 is an apparatus that is able to perform seamless switching between the 2.8 M DSD data and the PCM_AAC data of a predetermined content for reproduction.

The reproduction apparatus 12 includes a control unit 50, a communication unit 51, a decoding unit 52, a PCM upsampling unit 53, a delta-sigma (ΔΣ) modulation unit 54, a switching unit 55, a clock supply unit 56, and a delta-sigma demodulation unit 57.

The control unit 50 controls an overall operation of the reproduction apparatus 12. For example, when a user instructs reproduction of a predetermined content stored in the distribution apparatus 11 in an unillustrated operation unit, the control unit 50 selects one piece of audio data from two pieces of audio data (DSD data and PCM_AAC data) corresponding to a content that is instructed to be reproduced in accordance with the communication capacity of the network 24, and requests the selected piece of audio data from the distribution apparatus 11 via the communication unit 51. It is to be noted that, in FIG. 9, illustration of control signals from the control unit 50 to the respective units is omitted.

In a case where audio data is acquired as streaming data of a content in accordance with the MPEG-DASH, the control unit 50 acquires an MPD file previously, and causes the communication unit 51 to access a predetermined address of the distribution apparatus 11 on the basis of the acquired MPD file, thereby causing the communication unit 51 to acquire desired audio data. The MPD file includes, for example, information on the delay value of the PCM_AAC data.

The communication unit 51 requests audio data (DSD data and AAC data) of the content instructed to be reproduced, from the distribution apparatus 11 on the basis of an instruction of the control unit 50. In a case where the DSD data and the AAC data are set as first and second audio data, respectively, and switching is performed from the first audio data to the second audio data, the communication unit 51 simultaneously acquires two of the first and second audio data before or after the switching, and acquires one of the audio data in a case where no switching is necessary.

The communication unit 51 acquires digital audio data transmitted from the distribution apparatus 11. In a case where the acquired audio data is 2.8 M DSD data, the communication unit 51 supplies the acquired 2.8 M DSD data to the switching unit 55. Meanwhile, in a case where the acquired audio data is PCM_AAC data, the communication unit 51 supplies the acquired PCM_AAC data to the decoding unit 52.

The decoding unit 52 decodes the PCM_AAC data supplied from the communication unit 51 by a decoding method corresponding to the encoding method, and outputs a PCM signal resulting from the decoding to the PCM upsampling unit 53.

The PCM upsampling unit 53 upsamples the PCM signal supplied from the decoding unit 52 to have the same frequency as the sampling frequency of the 2.8 M DSD data, and outputs the upsampled PCM signal to the delta-sigma modulation unit 54. Specifically, the PCM upsampling unit 53 upsamples the PCM signal to have 2.8 MHz and outputs the upsampled PCM signal to the delta-sigma modulation unit 54.

The delta-sigma modulation unit 54 performs delta-sigma modulation on the upsampled PCM signal to generate 2.8 M DSD data, and outputs the generated 2.8 M DSD data to the switching unit 55.

The switching unit 55 selects one of the 2.8 M DSD data that is an output of the communication unit 51 or the 2.8 M DSD data that is an output of the delta-sigma modulation unit 54, and outputs the selected 2.8 M DSD data to the delta-sigma demodulation unit 57 in the subsequent stage.

The switching unit 55 is supplied with a delay value transmitted from the distribution apparatus 11. In a case where the switching unit 55 performs switching from the 2.8 M DSD data that is an output of the communication unit 51 to the 2.8 M DSD data that is an output of the delta-sigma modulation unit 54, delay is performed for the 2.8 M DSD data by a combined value of the delay value transmitted from the distribution apparatus 11 and a delay value resulting from processing from the decoding unit 52 to the delta-sigma modulation unit 54, and thereafter the switching is performed. This makes it possible to perform seamless switching even during reproduction of a content.

The clock supply unit 56 supplies a clock signal CLK2 corresponding to the 2.8 M DSD data to the delta-sigma demodulation unit 57. In the present embodiment, the clock supply unit 56 generates the clock signal CLK2 of 2.8 MHz and supplies the clock signal CLK2 to the delta-sigma demodulation unit 57.

The delta-sigma demodulation unit 57 demodulates (performs delta-sigma demodulation on) the 2.8 M DSD data supplied from the switching unit 55 using the clock signal CLK2 supplied from the clock supply unit 56, and outputs a demodulation result to the analog LPF 25 (FIG. 1) in the subsequent stage. It is possible to configure the delta-sigma demodulation unit 57, for example, by an FIR (finite impulse response) digital filter.

The above configuration enables the reproduction apparatus 12 to perform seamless switching between the 2.8 M DSD data and the PCM_AAC data of the predetermined content for reproduction.

<7. Mode for Simultaneous Transmission of DSD Data and PCM_AAC Data>

Next, description is given of a mode for simultaneous transmission of both of the 2.8 M DSD data and the PCM_AAC data.

For example, as illustrated in FIG. 2C, the distribution apparatus 11 transmits 2.8 M DSD data having a high sound quality for audio data on the front right side and the front left side, and transmits PCM_AAC data having a small data amount for audio data on the rear right side and the rear left side.

The storage unit 32 also stores the audio data on the rear right side and the rear left side as the 2.8 M DSD data; in a case where the audio data is transmitted as PCM data, the 2.8 M DSD data is converted into the PCM data by the PCM conversion unit 33, and the converted PCM data is transmitted to the reproduction apparatus 12. The 2.8 M DSD data on the front right side and the front left side is also transmitted to the reproduction apparatus 12 in parallel with the PCM data on the rear right side and the rear left side. The configuration of the distribution apparatus 11 is the same as that described with reference to FIG. 1.

It is to be noted that, in a case where predetermined conditions such as the capability of the reproduction apparatus 12 and the communication capacity of the network 24 are satisfied, the 2.8 M DSD data may be transmitted as it is, as a matter of course, also for the audio data on the rear right side and the rear left side, similarly to the front right side and the front left side.

FIG. 10 is a block diagram illustrating a configuration example of the reproduction apparatus 12 that simultaneously receives the 2.8 M DSD data on the front right side and the front left side and the PCM_AAC data on the rear right side and the rear left side, and outputs sounds from two speakers on the front right side and the front left side.

In FIG. 10, portions corresponding to those in FIG. 9 are denoted by the same reference numerals, and descriptions thereof are omitted where appropriate.

The reproduction apparatus 12 includes the communication unit 51, the decoding unit 52, the delta-sigma (ΔΣ) modulation unit 54, the clock supply unit 56, the delta-sigma demodulation unit 57, a delay unit 71, a surround processing unit 72, and a mixer 73. The mixer 73 includes addition units 81 and 82 and a delta-sigma modulation unit 83.

The communication unit 51 receives DSD_FL data that is 2.8 M DSD data on the front left side and DSD_FR data that is 2.8 M DSD data on the front right side, which are transmitted from the distribution apparatus 11, and supplies the received pieces of data to the delay unit 71.

In addition, the communication unit 51 receives AAC_RL data that is PCM_AAC data on the rear left side and AAC_RR data that is PCM_AAC data on the rear right side, which are transmitted from the distribution apparatus 11, and supplies the received pieces of data to the decoding unit 52.

The delay unit 71 delays the DSD_FL data and the DSD_FR data supplied from the communication unit 51 by a combined value of the delay value transmitted from the distribution apparatus 11 and a delay value resulting from processing of the decoding unit 52, the surround processing unit 72, and the delta-sigma modulation unit 54, and supplies the delayed pieces of data to the mixer 73. The DSD_FL data outputted from the delay unit 71 is supplied as DSD_FL1 data to the addition unit 81 of the mixer 73, and the DSD_FR data outputted from the delay unit 71 is supplied as DSD_FR1 data to the addition unit 82 of the mixer 73.

The decoding unit 52 decodes the AAC_RL data that is the PCM_AAC data on the rear left side and the AAC_RR data that is the PCM_AAC data on the rear right side, to obtain PCM_RL data and PCM_RR data, respectively. The obtained PCM_RL data and PCM_RR data are supplied to the surround processing unit 72.

The surround processing unit 72 executes surround conversion processing, in which even an output from speakers on front side is heard as if it came from rear side, on each of PCM_RL data that is PCM data on the rear left side and PCM_RR data that is PCM data on the rear right side, which are supplied from the decoding unit 52. The surround conversion processing causes the PCM_RL data on the rear left side to be converted into PCM_FL data on the front left side and the PCM_RR data on the rear right side to be converted into PCM_FR data on the front right side, and the converted pieces of data are supplied to the delta-sigma modulation unit 54.

The delta-sigma modulation unit 54 performs delta-sigma modulation on each of the PCM_FL data that is a PCM signal on the front left side and the PCM_FR data that is a PCM signal on the front right side. DSD_FL2 data resulting from the delta-sigma modulation of the PCM_FL data on the front left side is supplied to the addition unit 81 of the mixer 73. DSD_FR2 data resulting from the delta-sigma modulation of the PCM_FR data on the front right side is supplied to the addition unit 82 of the mixer 73.

The addition unit 81 of the mixer 73 adds the DSD_FL1 data from the delay unit 71 and the DSD_FL2 data from the delta-sigma modulation unit 54 together, and supplies DSD_FLa data that is an addition result to the delta-sigma modulation unit 83.

The addition unit 82 of the mixer 73 adds the DSD_FR1 data from the delay unit 71 and the DSD_FR2 data from the delta-sigma modulation unit 54 together, and supplies DSD_FRa data that is an addition result to the delta-sigma modulation unit 83.

The delta-sigma modulation unit 83 performs delta-sigma modulation on the DSD_FLa data from the addition unit 81, and supplies DSD_FLb data that is DSD data after the modulation, to the delta-sigma demodulation unit 57. In addition, the delta-sigma modulation unit 83 performs delta-sigma modulation on the DSD_FRa data from the addition unit 82, and supplies DSD_FRb data that is DSD data after the modulation, to the delta-sigma demodulation unit 57.

The delta-sigma demodulation unit 57 demodulates (performs delta-sigma demodulation on) the DSD_FLb data supplied from the delta-sigma modulation unit 83 using the clock signal CLK2 supplied from the clock supply unit 56, and outputs an analog signal Front_L on the front left side that is a demodulation result, to the analog LPF 25 (FIG. 1).

In addition, the delta-sigma demodulation unit 57 demodulates (performs delta-sigma demodulation on) the DSD_FRb data supplied from the delta-sigma modulation unit 83 using the clock signal CLK2 supplied from the clock supply unit 56, and outputs an analog signal Front_R on the front right side that is a demodulation result, to the analog LPF 25 (FIG. 1).

<8. Audio Data Reproduction Processing>

Next, with reference to a flowchart of FIG. 11, description is given of audio data reproduction processing performed by the reproduction apparatus 12 of FIG. 10, in which both of front two-channel 2.8 M DSD data and rear two-channel PCM_AAC data are simultaneously received and outputted only from two front speakers.

First, in step S10, the communication unit 51 receives the delay value transmitted as metadata from the distribution apparatus 11, and supplies the received delay value to the control unit 50.

In step S11, the communication unit 51 receives the front two-channel 2.8 M DSD data and the rear two-channel PCM_AAC data.

More specifically, the communication unit 51 receives the DSD_FL data that is the 2.8 M DSD data on the front left side and the DSD_FR data that is the 2.8 M DSD data on the front right side, which are transmitted from the distribution apparatus 11, and supplies the received pieces of data to the delay unit 71. In addition, the communication unit 51 receives the AAC_RL data that is the PCM_AAC data on the rear left side and the AAC_RR data that is the PCM_AAC data on the rear right side, which are transmitted from the distribution apparatus 11, and supplies the received pieces of data to the decoding unit 52.

In step S12, the delay unit 71 delays the DSD_FL data and the DSD_FR data supplied from the communication unit 51 by a predetermined period of time, and supplies the delayed pieces of data to the mixer 73. The delay time as used here corresponds to a sum value of the delay value transmitted from the distribution apparatus 11 and the delay value resulting from the processing of the decoding unit 52, the surround processing unit 72, and the delta-sigma modulation unit 54.

In step S13, the decoding unit 52 decodes the AAC_RL data on the rear left side and the AAC_RR data on the rear right side which are supplied from the communication unit 51. The PCM_RL data and the PCM_RR data resulting from the decoding are supplied to the surround processing unit 72.

In step S14, the surround processing unit 72 executes surround conversion processing for each of the PCM_RL data on the rear left side and the PCM_RR data on the rear right side which are supplied from the decoding unit 52. The surround conversion processing causes the PCM_RL data on the rear left side to be converted into the PCM_FL data on the front left side and the PCM_RR data on the rear right side to be converted into the PCM_FR data on the front right side, and the converted pieces of data are supplied to the delta-sigma modulation unit 54.

In step S15, the delta-sigma modulation unit 54 performs delta-sigma modulation on each of the PCM_FL data on the front left side and the PCM_FR data on the front right side. The DSD_FL2 data resulting from the delta-sigma modulation is supplied to the addition unit 81 of the mixer 73, and the DSD_FR2 data is supplied to the addition unit 82 of the mixer 73.

The processing of step S12 and the processing of steps S13 to S15 are executed in parallel. An output timing at which the DSD_FL data and the DSD_FR data are outputted, respectively, as the DSD_FL1 data and the DSD_FR1 data from the delay unit 71 in step S12 coincides with an output timing at which the DSD_FL2 data and the DSD_FR2 data are outputted from the delta-sigma modulation unit 54 in step S15.

In step S16, each of the addition units 81 and 82 of the mixer 73 adds first DSD data from the delay unit 71 and second DSD data from the delta-sigma modulation unit 54 together. More specifically, the addition unit 81 adds the DSD_FL1 data from the delay unit 71 and the DSD_FL2 data from the delta-sigma modulation unit 54 together, and supplies the DSD_FLa data that is the addition result to the delta-sigma modulation unit 83. The addition unit 82 adds the DSD_FR1 data from the delay unit 71 and the DSD_FR2 data from the delta-sigma modulation unit 54 together, and supplies the DSD_FRa data that is the addition result to the delta-sigma modulation unit 83.

In step S17, the delta-sigma modulation unit 83 performs delta-sigma modulation on the addition result. That is, the delta-sigma modulation unit 83 performs delta-sigma modulation on the DSD_FLa data from the addition unit 81, and supplies the DSD_FLb data after the modulation to the delta-sigma demodulation unit 57. In addition, the delta-sigma modulation unit 83 performs delta-sigma modulation on the DSD_FRa data from the addition unit 82, and supplies the DSD_FRb data after the modulation to the delta-sigma demodulation unit 57.

In step S18, the delta-sigma demodulation unit 57 performs delta-sigma demodulation on the DSD_FLb data and the DSD_FRb data after the delta-sigma modulation supplied from the delta-sigma modulation unit 83 using the clock signal CLK2 supplied from the clock supply unit 56, and outputs the analog signal Front_L on the front left side and the analog signal Front_R on the front right side, which are demodulation results, to the analog LPF 25, thereby finishing the audio data reproduction processing.

The audio data reproduction processing as described above enables the reproduction apparatus 12 to simultaneously receive both of the front two-channel 2.8 M DSD data and the rear two-channel PCM_AAC data, to convert the received pieces of data into signals for the two front speakers, and to output the converted signals.

It is to be noted that, in the example described above, the delay unit 71 that delays the received DSD data by a predetermined period of time is provided on side of the reproduction apparatus 12; however, the delay unit 71 may be configured to be provided in the distribution apparatus 11 on distribution side to allow for supply of DSD data delayed by a predetermined period of time.

<9. PCM Signal Conversion Apparatus>

In the above-described embodiment, the description has been given of the configuration of a server client system in which the distribution apparatus 11 is used as a server apparatus and the reproduction apparatus 12 is used as a client apparatus to distribute the DSD data or the PCM_AAC data as audio data via the network 24.

However, the present technology is not limited to the server client system, and is also applicable to, for example, a PCM signal conversion apparatus that converts DSD data stored in the storage unit 32 into PCM data and records the converted PCM data in a recording medium such as a BD (Blu-ray (registered trademark) Disc) or a DVD (Digital Versatile Disc).

FIG. 12 is a block diagram illustrating a configuration example of the PCM signal conversion apparatus. In FIG. 12, portions corresponding to those of the distribution apparatus 11 of FIG. 1 are denoted by the same reference numerals, and descriptions thereof are omitted.

The PCM signal conversion apparatus 90 of FIG. 12 is provided with a drive 91 instead of the transmission unit 35 of the distribution apparatus 11 of FIG. 1.

The drive 91 drives a recording medium 92 such as a BD or a DVD, and records, as audio data of a content, the 2.8 M DSD data supplied from the storage unit 32 and the PCM_AAC data supplied from the encoding unit 34, in the recording medium 92.

In the storage unit 32, audio data of a content is stored as DSD data with emphasis on a sound quality. Suppose a situation, for example, where audio data to be combined with an image is generated using a PCM signal and recorded in the recording medium 92.

As the DSD signal, a sampling frequency that is 64 times, 128 times, or 256 times the sampling frequency of a CD is used, whereas a sampling frequency of 48 kHz is typically used for an image.

In general, in a case of generating a PCM signal of 48 kHz from 2.8 M DSD data, it is common to first down-convert the 2.8 M DSD data to a PCM signal of about 44.1*8 kHz and thereafter generate data by linear interpolation, or the like; however, the sound quality deteriorates due to the interpolation. In addition, in a case where the sound quality is prioritized, a method is conceivable in which the 2.8 M DSD data is down-converted to a PCM signal of 44.1*8 kHz in the same manner; a signal after the down-conversion is up-converted 40 times; and further the up-converted signal is down-converted to 1/147. However, although this method enables accurate conversion to a PCM signal of 96 kHz, the processing is slow and impractical.

Meanwhile, according to the PCM signal conversion apparatus 90, it is possible to generate a PCM signal of 48 kHz accurately and easily from DSD data and to record the generated PCM signal in the recording medium 92 such as a BD or a DVD.

<10. Computer Configuration Example>

A series of processing executed by the signal processing apparatus such as the distribution apparatus 11, the reproduction apparatus 12, and the PCM signal conversion apparatus 90 described above is able to be executed by hardware or is able to be executed by software. In a case where the series of processing is executed by software, a program constituting the software is installed in a computer. Here, examples of the computer include a microcomputer incorporated in dedicated hardware and a general-purpose personal computer that is able to execute various functions by installing various programs.

FIG. 13 is a block diagram illustrating a configuration example of hardware of a computer that executes the series of processing described above by a program.

In the computer, a CPU (Central Processing Unit) 101, a ROM (Read Only Memory) 102, and a RAM (Random Access Memory) 103 are coupled to one another by a bus 104.

An input/output interface 105 is further coupled to the bus 104. An input unit 106, an output unit 107, a storage unit 108, a communication unit 109, and a drive 110 are coupled to the input/output interface 105.

The input unit 106 includes a keyboard, a mouse, a microphone, a touch panel, an input terminal, and the like. The output unit 107 includes a display, a speaker, an output terminal, and the like. The storage unit 108 includes a hard disk, a RAM disk, a nonvolatile memory, and the like. The communication unit 109 includes a network interface, and the like. The drive 110 drives a removable recording medium 111 such as a magnetic disk, an optical disk, a magneto-optical disk, or a semiconductor memory.

In the computer configured as described above, for example, the CPU 101 loads the program stored in the storage unit 108 into the RAM 103 via the input/output interfaces 105 and the bus 104 and executes the program, to thereby perform a series of processing such as the audio data transmission processing and the audio data reproduction processing described above. The RAM 103 also appropriately stores data and the like necessary for the CPU 101 to execute various types of processing.

In the computer, the program is able to be installed in the storage unit 108 via the input/output interface 105 by mounting the removable recording medium 111 on the drive 110. In addition, the program is able to be received by the communication unit 109 via a wired or wireless transmission medium such as a local area network, the Internet, or digital satellite broadcasting, and installed in the storage unit 108. Moreover, the program is able to be installed in advance in the ROM 102 or the storage unit 108.

It is to be noted that the program executed by the computer may be a program in which processing is performed in time series in the order described in the present specification, or may be a program in which processing is performed in parallel or at a necessary timing when a call is made, etc.

It is to be noted that, in the present specification, a system means a set of a plurality of components (apparatuses, modules (parts), etc.); it doesn't matter whether or not all the components are in the same housing. Accordingly, a plurality of apparatuses housed in separate housings and coupled via a network and one apparatus in which a plurality of modules is housed in one housing are each a system.

The embodiment of the present technology is not limited to the above-described embodiment, and various modifications are possible within a scope not departing from the gist of the present technology.

For example, it is possible to employ a mode in which all or portions of the above-described embodiments are combined as appropriate.

For example, it is possible, in the present technology, to adopt a configuration of cloud computing in which one function is shared and processed jointly by a plurality of apparatuses via a network.

It is possible for each step described in the above flowcharts to be executed by one apparatus, and, in addition, to be shared and executed by a plurality of apparatuses.

Further, in a case where a plurality of pieces of processing are included in one step, it is possible for the plurality of pieces of processing included in the one step to be executed by one apparatus, and, in addition, to be shared and executed by a plurality of apparatuses.

It is to be noted that the effects described herein are merely illustrative and are not limitative, and may include effects other than those described in the present specification.

It is to be noted that the present technology may include the following configurations.

(1)

A signal processing apparatus including:

an extraction section that, in a case where a PCM signal having a predetermined sampling frequency is generated from a DSD signal, extracts a predetermined number of samples from the DSD signal around samples at a predetermined interval determined by the predetermined sampling frequency; and a filtering section that generates the PCM signal having the predetermined sampling frequency by filtering the extracted predetermined number of samples.

(2)

The signal processing apparatus according to (1), in which the filtering section includes a table that associates data employable by the extracted predetermined number of samples and an operation result at that time with each other, and the filtering section filters the extracted predetermined number of samples by determining an operation result corresponding to the extracted predetermined number of samples with reference to the table.

(3)

The signal processing apparatus according to (2), in which the table is configured by a plurality of partial sum tables divided in a unit of a predetermined number of bits, and the filtering section determines partial sums corresponding to samples in the unit of the predetermined number of bits with reference to the respective partial sum tables, and adds the partial sums of the plurality of partial sum tables together to determine the operation result.

(4)

The signal processing apparatus according to any one of (1) to (3), further including:

a storage unit that stores the DSD signal; and a transmission unit that transmits at least one of the DSD signal or the PCM signal to another apparatus.

(5)

The signal processing apparatus according to (4), in which the transmission unit also transmits a delay value of the PCM signal with respect to the DSD signal, to the other apparatus.

(6)

The signal processing apparatus according to (4), in which the transmission unit performs switching between the DSD signal and the PCM signal of same content for transmission to the other apparatus.

(7)

The signal processing apparatus according to (4), in which the transmission unit transmits both of the DSD signal and the PCM signal to the other apparatus.

(8)

The signal processing apparatus according to (7), in which the transmission unit transmits the DSD signal to the other apparatus in a delayed manner by a delay value of the PCM signal with respect to the DSD signal.

(9)

The signal processing apparatus according to (7) or (8), in which the DSD signal includes front side audio data, and the PCM signal includes rear side audio data.

(10)

A signal processing method including causing a signal processing apparatus, which generates a PCM signal having a predetermined sampling frequency from a DSD signal, to extract a predetermined number of samples from the DSD signal around samples at a predetermined interval determined by the predetermined sampling frequency, and generate the PCM signal having the predetermined sampling frequency by filtering the extracted predetermined number of samples.

(11)

A program that causes a computer to execute processing, the processing including:

extracting, in a case where a PCM signal having a predetermined sampling frequency is generated from a DSD signal, a predetermined number of samples from the DSD signal around samples at a predetermined interval determined by the predetermined sampling frequency; and generating the PCM signal having the predetermined sampling frequency by filtering the extracted predetermined number of samples.

REFERENCE NUMERALS LIST 1 reproduction system
11 distribution apparatus
12 reproduction apparatus
31 control unit
32 storage unit
33 PCM conversion unit
34 encoding unit
35 transmission unit
41 extraction section
42 filtering section
50 control unit
51 communication unit
52 decoding unit
53 PCM upsampling unit
54 delta-sigma modulation unit
55 switching unit
57 delta-sigma demodulation unit
71 delay unit
72 surround processing unit
73 mixer
90 PCM signal conversion apparatus
91 drive
92 recording medium
101 CPU
102 ROM
103 RAM
106 input unit
107 output unit
108 storage unit
109 communication unit
110 drive

The invention claimed is:

1. A signal processing apparatus, comprising:
an extraction section configured to, in a case where a pulse code modulation (PCM) signal having a determined sampling frequency is generated from a direct stream digital (DSD) signal, extract a determined number of samples from the DSD signal around center position samples of the DSD signal at a determined interval, wherein the determined interval is determined based on the determined sampling frequency; and
a filtering section that comprises a table that stores data employable by the extracted determined number of samples in association with an operation result, wherein the filtering section is configured to:
filter the extracted determined number of samples by determination of the operation result corresponding to the extracted determined number of samples with reference to the table; and
generate the PCM signal having the determined sampling frequency by the filtering of the extracted determined number of samples.

2. The signal processing apparatus according to claim 1, wherein
the table comprises a plurality of partial sum tables divided in a unit of a determined number of bits, and
the filtering section is further configured to:
determine partial sums corresponding to samples in the unit of the determined number of bits with reference to respective partial sum tables of the plurality of partial sum tables; and add the partial sums of the plurality of partial sum tables together to determine the operation result.

3. The signal processing apparatus according to claim 1, further comprising:
a storage unit configured to store the DSD signal; and
a transmission unit configured to transmit at least one of the DSD signal or the PCM signal to an external apparatus.

4. The signal processing apparatus according to claim 3, wherein the transmission unit is further configured to transmit a delay value of the PCM signal, with respect to the DSD signal, to the external apparatus.

5. The signal processing apparatus according to claim 3, wherein the transmission unit is further configured to perform a switch between the DSD signal and the PCM signal of same content for transmission to the external apparatus.

6. The signal processing apparatus according to claim 3, wherein the transmission unit is further configured to transmit the DSD signal and the PCM signal to the external apparatus.

7. The signal processing apparatus according to claim 6, wherein the transmission unit is further configured to transmit the DSD signal to the external apparatus in a delayed manner by a delay value of the PCM signal with respect to the DSD signal.

8. The signal processing apparatus according to claim 6, wherein
the DSD signal comprises front side audio data, and
the PCM signal comprises rear side audio data.

9. A signal processing method, comprising:
in a signal processing apparatus:
storing a table that comprises data employable by a determined number of samples of a direct stream digital (DSD) signal in association with an operation result;
extracting, in a case where a pulse code modulation (PCM) signal having a determined sampling frequency is generated from the DSD signal, the determined number of samples from the DSD signal around center position samples of the DSD signal at a determined interval, wherein the determined interval is determined based on the determined sampling frequency;
filtering the extracted determined number of samples by determination of the operation result corresponding to the extracted determined number of samples with reference to the table; and
generating the PCM signal having the determined sampling frequency by the filtering of the extracted determined number of samples.

10. A non-transitory computer-readable medium having stored thereon, computer-executable instructions which, when executed by a processor, cause the processor to execute operations, the operations comprising:
storing a table that comprises data employable by a determined number of samples of a direct stream digital (DSD) signal in association with an operation result;
extracting, in a case where a PCM signal having a determined sampling frequency is generated from the DSD signal, the determined number of samples from the DSD signal around determined center position samples of the DSD signal at a determined interval, wherein the determined interval is determined based on the determined sampling frequency;
filtering the extracted determined number of samples by determination of the operation result corresponding to the extracted determined number of samples with reference to the table; and
generating the PCM signal having the determined sampling frequency by the filtering of the extracted determined number of samples.

11. A signal processing apparatus, comprising:
an extraction section configured to, in a case where a pulse code modulation (PCM) signal having a determined sampling frequency is generated from a direct stream digital (DSD) signal, extract a determined number of samples from the DSD signal around center position samples of the DSD signal at a determined interval, wherein the determined interval is determined based on the determined sampling frequency;
a filtering section configured to generate the PCM signal having the determined sampling frequency by filtering the extracted determined number of samples;
a storage unit configured to store the DSD signal; and
a transmission unit configured to transmit at least one of the DSD signal or the PCM signal to an external processing apparatus.

* * * * *